United States Patent [19]

Ryczek et al.

[11] Patent Number: 4,521,748
[45] Date of Patent: Jun. 4, 1985

[54] ADJUSTABLE FREQUENCY OSCILLATOR

[75] Inventors: Lawrence J. Ryczek, Nashotah; William J. Janutka, West Allis, both of Wis.

[73] Assignee: Eaton Corporation, Cleveland, Ohio

[21] Appl. No.: 509,951

[22] Filed: Jun. 30, 1983

[51] Int. Cl.$^3$ ............................................. H03K 3/023
[52] U.S. Cl. ................................ 331/108 D; 331/111; 331/143
[58] Field of Search ............... 331/108 D, 111, 113 R, 331/143, 144

[56] References Cited

U.S. PATENT DOCUMENTS 3,555,469  1/1971  Harvey, Jr. .......................... 331/111
3,713,046  1/1973  Wong et al. ......................... 331/111
3,895,315  7/1975  Way ................................... 331/111

OTHER PUBLICATIONS

Bergman, "Centre-Zero Potentiometer-Controlled Oscillator", New Electronics, vol. 13, No. 13, Jun. 24, 1980, p. 86.

"Variable Pulse Width Generator", Elektor, Jul./Aug. 1980, pp. 7-74.

Primary Examiner—Siegfried H. Grimm
Attorney, Agent, or Firm—Andrus, Sceales, Starke & Sawall

[57] ABSTRACT

An adjustable frequency oscillator 2 is provided by a comparator timer 4 having a potentiometer 6 at its output 8 for concurrently changing both charging current and threshold trip voltage to control the frequency of oscillation of the comparator output. The oscillator is ideal for proximity switch applications, particularly photoelectric type proximity switches, for timing a delayed output signal following a given sensed condition.

16 Claims, 3 Drawing Figures

ADJUSTABLE FREQUENCY OSCILLATOR

BACKGROUND AND SUMMARY

The invention provides an adjustable frequency oscillator using a comparator timer. Single means, such as a potentiometer, concurrently changes both charging current and threshold trip voltage to change the frequency of oscillation of the comparator output.

The circuitry features expanded frequency range, reduced power consumption and improved adjustment resolution.

Though not limited thereto, the oscillator was developed for proximity switches and is particularly useful in photoelectric type proximity switches for timing a delayed output signal following a given sensed condition. The wide range together with the low power consumption makes the oscillator ideal for such proximity switch application.

DETAILED DESCRIPTION

Figure 1:
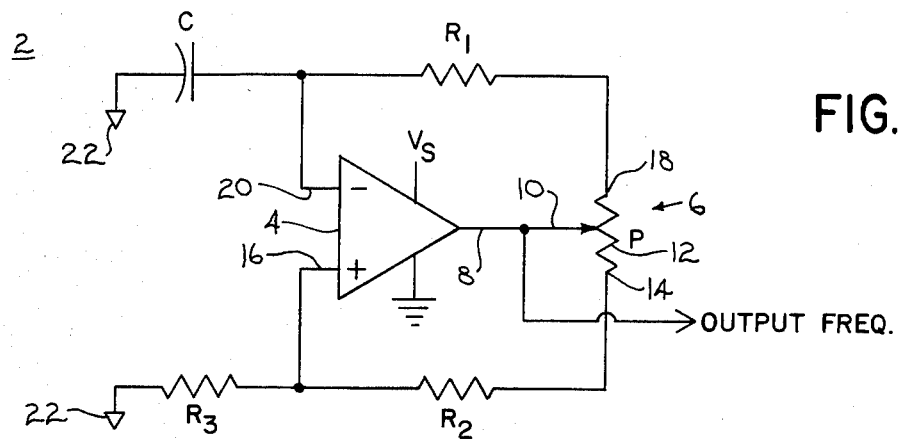
FIG. 1 is a circuit diagram of an adjustable frequency oscillator constructed in accordance with the invention.

FIG. 1 shows an adjustable frequency oscillator 2 comprising in combination comparator means 4 and single means 6 at the output 8 of the comparator for currently changing both charging current and threshold trip voltage for the comparator to change the frequency of oscillation of the comparator output. Means 6 is adjusted in one direction to increase charging current and decrease threshold trip voltage, to increase oscillation frequency. Means 6 is adjusted in another direction to decrease charging current and increase threshold trip voltage, to decrease oscillation frequency. In the preferred embodiment, means 6 is a potentiometer.

Potentiometer 6 comprises a wiper 10 connected from the comparator output to a variable point along a pot resistor 12. The lower end 14 of the pot resistor is connected to a reference threshold input terminal 16 of the comparator, such as the plus input of an operational amplifier. The bottom end 14 of the pot resister is preferably connected in a voltage divider network, provided by resistors $R_2$ and $R_3$, to reference input terminal 16 of the comparator. The upper end 18 of the pot resistor is connected in an RC circuit, provided by resistor $R_1$ and capacitor C, to a comparing input terminal 20 of the comparator, such as the minus terminal of an operational amplifier, for comparison against the reference input terminal 16. The connection of input terminals 16 and 20 may be interchanged.

When wiper 10 is moved downwardly, the threshold trip voltage at reference input terminal 16 is increased, and the charging current to capacitor C is decreased. It thus takes longer for the voltage at comparing input terminal 20 to rise in a given polarity direction above the voltage at reference input terminal 16. This decreases the oscillation frequency of comparator output 8.

When wiper 10 is moved upwardly, the threshold trip voltage at reference input terminal 16 is decreased, and the charging current to capacitor C is increased. It thus takes less time for the voltage at comparing input terminal 20 to rise in a given polarity direction above the voltage at reference input terminal 16. This increases the oscillation frequency of comparator output 8.

Comparator output 8 switches states when the voltage at comparing input terminal 20 rises above the voltage at reference input terminal 16 due to the charging of capacitor C. When output 8 switches states, capacitor C begins charging in the other polarity direction until the voltage at comparing input terminal 20 drops below the voltage at reference input terminal 16. Comparator output 8 then switches states again, to complete an oscillation cycle which is repeated at a frequency controlled by potentiometer 6. Capacitor C thus charges in alternate polarity directions during alternate half cycles, and reference input terminal 16 is at alternate high and low levels during alternate half cycles, according to the oscillating alternating state of output 8.

Figure 2:
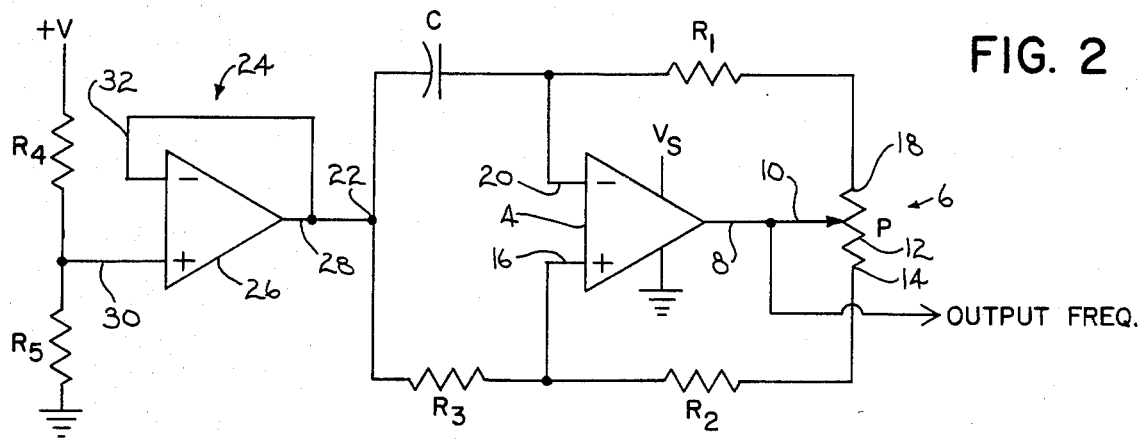
FIG. 2 is a circuit diagram showing a further preferred implementation of the circuit of FIG. 1.

The voltage divider network, $R_2$ and $R_3$, and the RC circuit, $R_1$ and C, are connected to a reference voltage as indicated at 22. Referring to FIG. 2, reference voltage 22 is provided by voltage follower means 24. The voltage follower means comprises an operational amplifier 26 having an output 28 connected at reference voltage point 22 to the voltage divider network and the RC circuit. Op amp 26 has one input 30 supplied by a given voltage V, and another input 32 connected in feedback relation from output 28 such that the voltage on output 28 follows the voltage on input 30. If the voltage on input 30 rises, then the voltage at output 28 also rises, which increased voltage is fed back to the other input 32 for comparison against the on input 30, and the output continues to change until the inputs are in balance. The voltage on input 30 is supplied through a voltage divider network provided by resistors $R_4$ and $R_5$.

Figure 3:
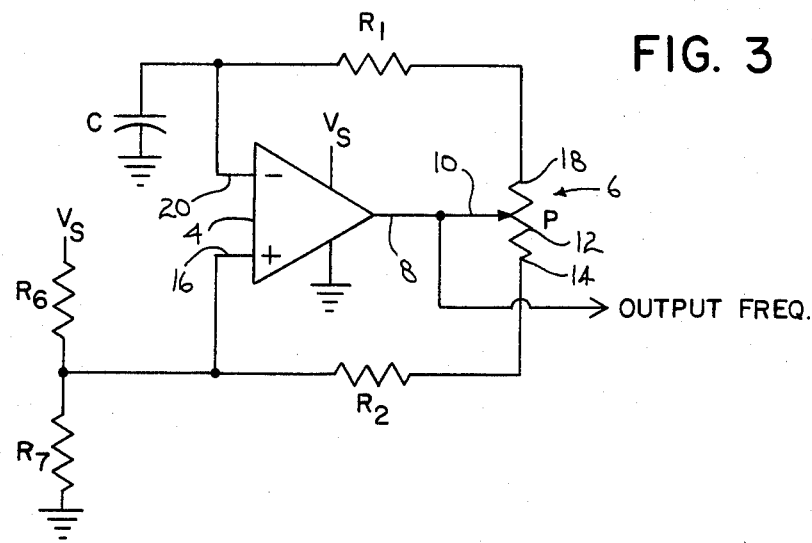
FIG. 3 is a circuit diagram showing an alternate embodiment of FIG. 2.

In FIG. 3, the parallel combination of resistors $R_6$ and $R_7$ sets the reference voltage and acts as part of the resistance divider network for the positive feedback portion of the oscillator circuit. The ratio of $R_6$ to $R_7$ is the same as the ratio of $R_4$ to $R_5$ of Fig. 2, and if the equivalent resistance of the parallel combination of $R_6$ and $R_7$ is the same as the resistance $R_3$ of FIG. 2, and if the values of C, $R_1$, P and $R_2$ of both FIGS. 2 and 3 are equal, then the output frequency and duty cycle of FIGS. 2 and 3 will be equal. Because capacitor C of FIG. 3 is connected to the negative supply, on start-up, the first half cycle of oscillation will have an extended time period while the capacitor charges up to the required offset voltage. The circuit of FIG. 2 does not have this start-up delay characteristic. In FIGS. 1 and 2, the RC circuit and the voltage divider network are connected to a common reference voltage, and this provides faster start-up. In Fig. 3, the RC circuit and the voltage divider network are connected to different reference voltages.

It is recognized that various modifications are possible within the scope of the appended claims.

We claim:

1. An adjustable frequency oscillator comprising in combination comparator means having a comparing input terminal connected to an RC charging current circuit, and a reference threshold input terminal, and comparing voltage at said comparing input terminal due to said charging current against threshold trip voltage at said reference terminal, and single means at the output of said comparator means for concurrently changing both charging current and threshold trip voltage for said comparator means to change the frequency of oscillation of said comparator means output.

2. The invention according to claim 1 wherein said single means is adjusted in one direction to increase charging current and decrease threshold trip voltage to increase oscillation frequency, and wherein said single means is adjusted in another direction to decrease charging current and increase threshold trip voltage to decrease oscillation frequency.

3. The invention according to claim 1 wherein said single means comprises potentiometer means.

4. The invention according to claim 3 wherein:
said potentiometer means comprises a wiper connected from said comparator means output to a variable point along a pot resistor, the lower end of said pot resistor connected to said reference threshold input terminal of said comparator means, the upper end of said pot resistor connected through said RC circuit, comprising a resistor R and a capacitor C, to said comparing input terminal of said comparator means for comparison against said reference input terminal;

such that when said wiper is moved downwardly, the threshold trip voltage at said reference input terminal is increased, and the charging current to said capacitor C is decreased, such that it takes longer for the voltage at said comparing input terminal to rise in a given polarity direction above the voltage at said reference input terminal, to decrease the oscillation frequency of said comparator means output;

such that when said wiper is moved upwardly, the threshold trip voltage at said reference input terminal is decreased, and the charging current to said capacitor C is increased, such that it takes less time for the voltage at said comparing input terminal to rise in a given polarity direction above the voltage at said reference input terminal, to increase the oscillation frequency of said comparator means output;

said comparator means output switches states when the voltage at said comparing input terminal rises in a given polarity direction above the voltage at said reference input terminal, whereupon said capacitor C charges in the other polarity direction until the voltage at said comaparing input terminal drops in the given polarity direction below the voltage at said reference input terminal, whereupon said comparator means output again switches states to complete an oscillation cycle which is repeated at a frequency controlled by said potentiometer means.

5. The invention according to claim 4 wherein said comparator means output alternates between high and low polarity states during alternate half cycles of said oscillation, and said capacitor C charges in alternate polarity directions during alternate half cycles of said oscillation.

6. The invention according to claim 5 wherein the voltage at said reference input terminal alternates between high and low states during alternate half cycles of said oscillation.

7. The invention according to claim 4 wherein the bottom end of said pot resistor is connected in a voltage divider network to said reference input terminal of said comparator means.

8. The invention according to claim 7 wherein said comparator means comprises an operational amplifier.

9. The invention according to claim 7 wherein said voltage divider network and said RC circuit are connected to a common reference voltage.

10. The invention according to claim 7 wherein said voltage divider network and said RC circuit are connected to different reference voltage points.

11. The invention according to claim 9 wherein said reference voltage is provided by voltage follower means.

12. The invention according to claim 11 wherein said voltage follower means comprises an operational amplifier having an output connected to said voltage divider network and said RC circuit, having one input supplied by a given voltage, and having another input connected in feedback relation from the output such that the voltage on the output follows the voltage on the one input.

13. The invention according to claim 12 wherein the voltage on said one input of said operational amplifier is supplied through a voltage divider network.

14. The invention according to claim 4 wherein the bottom end of said pot resistor is connected in a resistor network to said reference input terminal of said comparator means, and wherein said resistor network and said RC circuit are connected to a common reference voltage.

15. The invention according to claim 4 wherein the bottom end of said pot resistor is connected in a resistor network to said reference input terminal of said comparator means, and wherein said resistor network and said RC circuit are connnected to different reference voltage points.

16. A proximity switch adjustable frequency oscillator comprising in combination comparator means and potentiometer means at the output of said comparator means for concurrently changing both charging current and threshold trip voltage for said comparator means to change the frequency of oscillation of said comparator means output,
said potentiometer means comprising a wiper connected from said comparator means output to a variable point along a pot resistor, the lower end of said pot resistor connected to a reference threshold input terminal of said comparator means, the upper end of said pot resistor connected in an RC circuit to a comparing input terminal of said comparator means for comparison against said reference input terminal, such that when said wiper is moved downwardly, the threshold trip voltage at said reference input terminal is increased, and the charging current to said capacitor C is decreased, such that it takes longer for the voltage at said comparing input terminal to rise in a given polarity direction above the voltage at said reference input terminal, to decrease the oscillation frequency of said comparator means output, such that when said wiper is moved upwardly, the threshold trip voltage at said reference input terminal is decreased, and the charging current to said capacitor C is increased, such that it takes less time for the voltage at said comparing input terminal to rise in a given polarity direction above the voltage at said reference input terminal, to increase the oscillation frequency of said comparator means output, said comparator means output switching states when the voltage at said comparing input terminal rises in a given polarity direction above the voltage at said reference input terminal, whereupon said capacitor C charges in the other polarity direction until the voltage at said comparing input terminal drops in the given polarity direction below the voltage at said reference input terminal, whereupon said comparator means output again switches states to complete an oscillation cycle which is repeated at a frequency controlled by said potentiometer means.

* * * * *